United States Patent
Arima et al.

[11] Patent Number: 6,091,088
[45] Date of Patent: Jul. 18, 2000

[54] MACRO CELL

[75] Inventors: Yoshiaki Arima; Takenobu Iwao; Nobuyuki Ikeda; Shuichi Kato, all of Tokyo, Japan

[73] Assignee: Mitsubishi Denki Kabushiki Kaisha, Tokyo, Japan

[21] Appl. No.: 09/015,068

[22] Filed: Jan. 28, 1998

[30] Foreign Application Priority Data

Sep. 8, 1997 [JP] Japan .................................. 9-243151

[51] Int. Cl.$^7$ .................................................. H01L 27/10
[52] U.S. Cl. ........................ 257/202; 257/208; 257/773
[58] Field of Search .................................. 257/202, 208, 257/773, 401, 382, 413

[56] References Cited

U.S. PATENT DOCUMENTS 4,905,073  2/1990  Chen et al. ............................. 257/770

OTHER PUBLICATIONS

Itoh et al., "Session XIV: Array And Gb Logic", IEEE International Solid–State Circuits Conference, Feb. 1982, pp. 176–177.

*Primary Examiner*—Mark V. Prenty
*Attorney, Agent, or Firm*—Leydig, Voit & Mayer

[57] ABSTRACT

A macro cell of field effect transistors includes source-drain areas respectively divided into a contact area and a non-contact area. One source-drain area of two of the source-drain areas located on opposite sides of the effective width portion of a gate electrode has a contact area at an upper portion and a non-contact area at a lower portion while the other source-drain area has the non-contact area at its upper portion and the contact area at its lower portion. The distance between effective width portions of gate electrodes where the non-contact area is located is smaller than the distance between effective width portions of gate electrodes where the contact area is located.

6 Claims, 10 Drawing Sheets

PRIOR ART

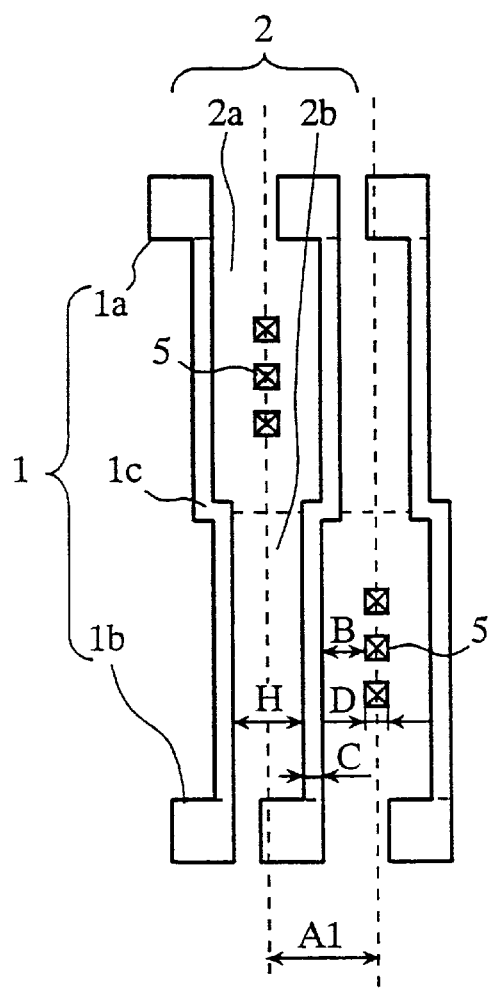
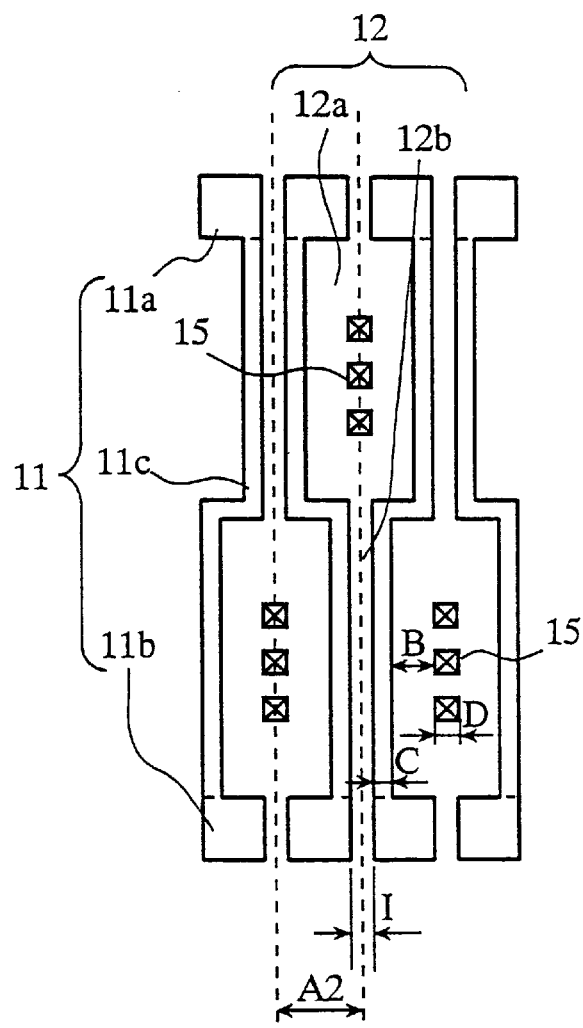

MACRO CELL

BACKGROUND OF THE INVENTION

1. Field of the Invention

The present invention relates to macro cells used for gate arrays, ECAs (embedded cell arrays), and the like.

2. Description of the Prior Art

FIG. 8 is a schematic plan view showing a structure of a conventional semiconductor integrated circuit gate array. Referring to FIG. 8, a semiconductor substrate 101 has a cell area 102 having transistors arranged over all of its surface and forming circuits performing desired functions through connections between the transistors, and a buffer area 103 in which I/O buffers are disposed. The cell area 102 is located at the central portion of the semiconductor substrate 101 and the buffer area 103 is located at the peripheral portion of the semiconductor substrate 101.

In the cell area 102, a macro cell 104 includes logic circuits, such as AND circuits and OR circuits, or circuits having functions on a logic gate level, such as flip-flop circuits, incorporating a plurality of transistors. A macro cell area 105 includes a plurality of macro cells 104 arranged along a row direction, and inter-cell wiring 106 provides connections between macro cells 104 disposed in different macro cell areas 105. A wiring area 107 provides connections between macro cells 104 disposed in different macro cell areas 105 by the inter-cell wiring 106. The macro cell area 105 and the wiring area 107 are alternatingly arranged along a column direction. In FIG. 8, only portions of the macro cell areas 105 and wiring areas 107 are shown.

FIG. 9 is a plan view showing a structure of a conventional macro cell, an enlarged view of the area surrounded by the rectangle 108 of FIG. 8. FIG. 9 shows an example of a four-input NAND circuit shown in FIG. 10. Referring to FIG. 9, a gate electrode 109 is oriented in the column direction (in the Y direction in FIG. 9) and has a first end having a rectangular shape and located at the upper end, a second end having a rectangular shape and located at the lower end, and an effective width portion along a straight line connecting the first end with the second end. A source-drain area 110 is disposed between the effective width portions of adjoining gate electrodes 109. A group of transistors 111, including a plurality of gate electrodes 109 arranged in the row direction (in the X direction in FIG. 9) and having respective source-drain areas 110, is disposed between the effective width portions of adjoining gate electrodes 109. An intra-cell wiring 112 provides a connection between transistors within the macro cell 104. A first contact 113 connects the intra-cell wiring 112 with the source-drain area 110. A second contact 114 connects the intra-cell wiring 112 with the gate electrode 109, and a third contact 115 connects the intra-cell wiring 112 to the inter-cell wiring 106. There are two groups of transistors 111 arranged along the column direction with the positions of the gate electrodes 109 and the positions of the source-drain areas 110 in alignment. The upper group of transistors are P-channel transistors and the lower group of transistors are N-channel transistors. A, B, C, D, and Y in FIG. 9 correspond to A, B, C, D, and Y in FIG. 10, respectively.

The inter-cell wiring 106 lies along the row direction and the column direction. The inter-cell wiring 106 across the macro cell area 105 is aluminum wiring in a second layer (hereinafter called second-layer aluminum wiring) and the rest of the inter-cell wiring 106 is either aluminum wiring in a first layer (hereinafter called first-layer aluminum wiring) or the second-layer aluminum wiring. Meanwhile, the intra-cell wiring 112 lies along the row direction or the column direction and is first-layer aluminum wiring.

Generally, the first-layer aluminum wiring and the second-layer aluminum wiring along the column direction are arranged at a constant wiring pitch along the row direction. The wiring pitch of the first-layer aluminum wiring along the row direction and the wiring pitch of the second-layer aluminum wiring along the row direction are the same. Further, the wiring pitch of the first-layer aluminum wiring and the second-layer aluminum wiring along the row direction is larger than the minimum wiring pitch of the first-layer aluminum wiring and the second-layer aluminum wiring along the row direction that can be achieved due to the limits of the processing technology used to produce the wiring. More specifically, as shown in FIG. 11A, the wiring pitch A of the first-layer aluminum wiring and the second-layer aluminum wiring along the row direction is A=B×2+C+D, where B is the minimum distance between the effective width portion of the gate electrode 109 and the first contact 113, C is the length of the effective width portion of the gate electrode 109 along the row direction, and D is the length of the first contact 113 along the row direction. As shown in FIG. 11B, the minimum wiring pitch E of the first-layer aluminum wiring and the second-layer aluminum wiring along the row direction achievable considering the limits of the processing technology used is E=F+G, where F is the length of the first-layer aluminum wiring and the second-layer aluminum wiring along the row direction, G is the wiring distance between the first-layer aluminum wiring and the second-layer aluminum wiring, and A>E.

SUMMARY OF THE INVENTION

Since a conventional macro cell was configured as described, the wiring pitch of the first-layer aluminum wiring and the second-layer aluminum wiring along the row direction was larger than the minimum wiring pitch of the first-layer aluminum wiring and the second-layer aluminum wiring along the row direction that could be achieved due to the limitations of the processing technology used. Thus, there has been a problem that the occupied area is larger and, accordingly, the degree of integration in the cell area is smaller.

The present invention has been made to solve the problem described and it is an object of the invention to provide a macro cell in which the occupied area can be made smaller and the degree of integration in the cell area can be made higher.

According to a first aspect of the invention, a macro cell has a source-drain area divided along a column direction into a contact area having a contact for connecting a first-layer wiring thereto and a non-contact area having no contact. A first source-drain area located across the effective width portion of the gate electrode has the contact area at an upper portion and the non-contact area at a lower portion. A second source-drain area has the non-contact area at an upper portion and the contact area at a lower portion. The effective width portion of the gate electrode is bent at the boundary between the contact area and the non-contact area, whereby the distance between the effective width portions of the gate electrodes where the non-contact area is interposed is smaller than the distance between the effective width portions of the gate electrodes where the contact area is interposed.

In accordance with the first aspect, since the macro cell is configured as described, the occupied area is reduced and the degree of integration in the cell area is increased.

According to a second aspect of the invention, a macro cell is configured such that the distance between the effective width portions of the gate electrodes located at the first end portion, where the non-contact area is interposed, is equal to the distance between the first end portions of the gate electrodes, and the distance between the effective width portions of the gate electrodes located at the second end portion, where the non-contact area is interposed, is equal to the distance between the second end portions of the gate electrodes.

In accordance with the second aspect, since the macro cell is configured as described, the occupied area is reduced and the degree of integration in the cell area is increased.

According to a third aspect of the invention, a macro cell has a salicide structure with the gate electrodes and the source-drain areas silicided. In accordance with the third aspect, since the gate electrodes and the source-drain areas are silicided, the contact resistance of the gate electrode and the contact resistance of the source-drain area is lowered.

BRIEF DESCRIPTION OF THE DRAWINGS

FIG. 5A and FIG. 5B are plan views for describing the wiring pitch of a first-layer aluminum wiring and a second-layer aluminum wiring along the row direction of a macro cell according to the second embodiment of the invention;

DETAILED DESCRIPTION OF THE PREFERRED EMBODIMENTS

First Embodiment

Figure 1:
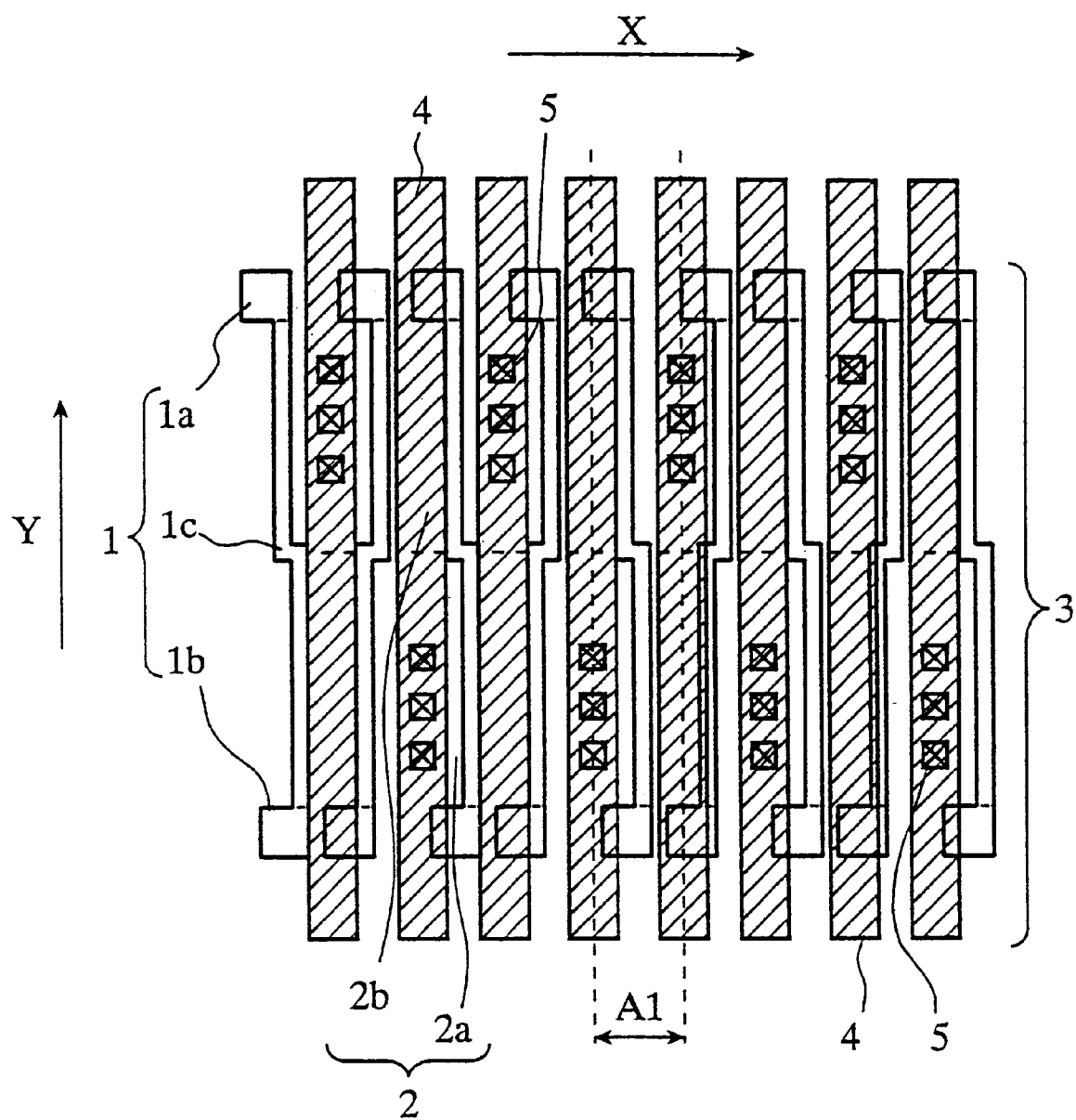
FIG. 1 is a plan view showing in a simplified manner a structure of a macro cell according to a first embodiment of the invention.

FIG. 1 is a plan view showing in a simplified manner a structure of a macro cell according to a first embodiment of the invention. Referring to FIG. 1, a gate electrode 1 is oriented in the column direction (the Y direction in FIG. 1) and includes a first end portion 1a having a rectangular shape and located at the upper end, a second end portion 1b having a rectangular shape and located at the lower end. An effective width portion 1c connects the first end portion 1a with the second end portion 1b and is bent at the boundary between a contact area 2a and a non-contact area 2b. A source-drain area 2 is located between effective width portions 1c of adjoining gate electrodes 1 and divided, along the column direction, into a contact area 2a with a contact 5 for connecting the intra-cell wiring 4 thereto and a non-contact area 2b with no contact 5. A group of transistors 3 includes a plurality of gate electrodes 1 arranged in the row direction (the X direction in FIG. 1) and respective source-drain areas 2 disposed between the effective width portions 1c of adjoining gate electrodes 1. An intra-cell wiring (first-layer wiring) 4 provides a connection between transistors within the macro cell. A contact 5 connects the intra-cell wiring 4 with the source-drain area 2. Since the macro cell structure according to the first embodiment of the invention is shown in a simplified manner in FIG. 1, only the intra-cell wirings 4 along the column direction are shown. Intra-cell wirings along the row direction are not shown. Further, only the contacts 5 connecting the intra-cell wiring 4 with the source-drain area 2 are shown. Contacts connecting the intra-cell wiring 4 with the gate electrode 1 and connecting the intra-cell wiring 4 to the inter-cell wiring are not shown.

In the macro cell according to the first embodiment of the invention, the source-drain area 2 is divided, along the column direction, into the contact area 2a with the contact 5 connecting the intra-cell wiring 4 thereto and the non-contact area 2b with no contact 5. Two source-drain areas 2 are located on opposite sides of an effective width portion 1c of the gate electrode 1, one source-drain area having the contact area 2a at an upper portion and the non-contact area 2b at a lower portion. The other source-drain area has the non-contact area 2b at an upper portion and the contact area 2a at a lower portion. At an upper portion of a group of transistors 3, the contact areas 2a and the non-contact areas 2b are alternatingly arranged with the effective width portion 1c of a gate electrode 1 interposed and, at the lower portion of the group of transistors 3, the contact areas 2a and the non-contact areas 2b are alternatingly arranged in reverse sequence to that in the upper portion of the group of transistors 3, with the effective width portion 1c of the gate electrode 1 interposed.

By bending the effective width portion 1c of the gate electrode 1 at the boundary between the contact area 2a and the non-contact area 2b, the distance between the gate electrodes 1 where the non-contact area 2b is interposed is smaller than the distance between the effective width portions 1c of the gate electrodes where the contact area 2a is interposed.

Figure 2A:
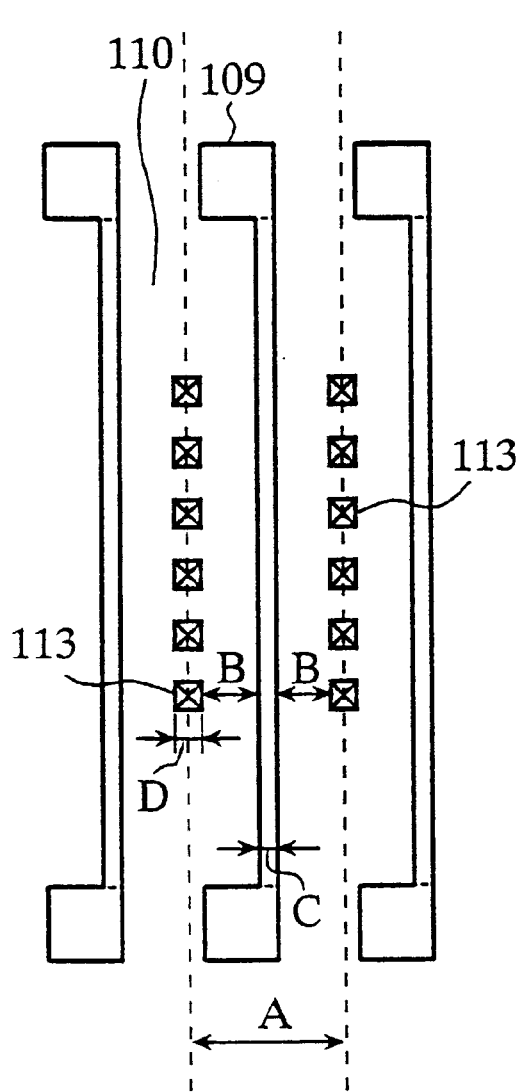
FIG. 2A and FIG. 2B are plan views for describing the wiring pitch of a first-layer aluminum wiring and a second-layer aluminum wiring along the row direction of a macro cell according to the first embodiment of the invention.

Therefore, in the first embodiment, the wiring pitch of the first-layer aluminum wiring and the second-layer aluminum wiring, which extend along the column direction, is smaller in the row direction than in the prior art. In the prior art, as shown in FIG. 2A, the wiring pitch A of the first-layer aluminum wiring and the second-layer aluminum wiring in the row direction is A=B×2+C+D, where B is the minimum distance between the effective width portion of the gate electrode 109 and the first contact 113, C is the length of the effective width portion of the gate electrode 109 along the row direction, and D is the length of the first contact 113 along the row direction.

Figure 2B:
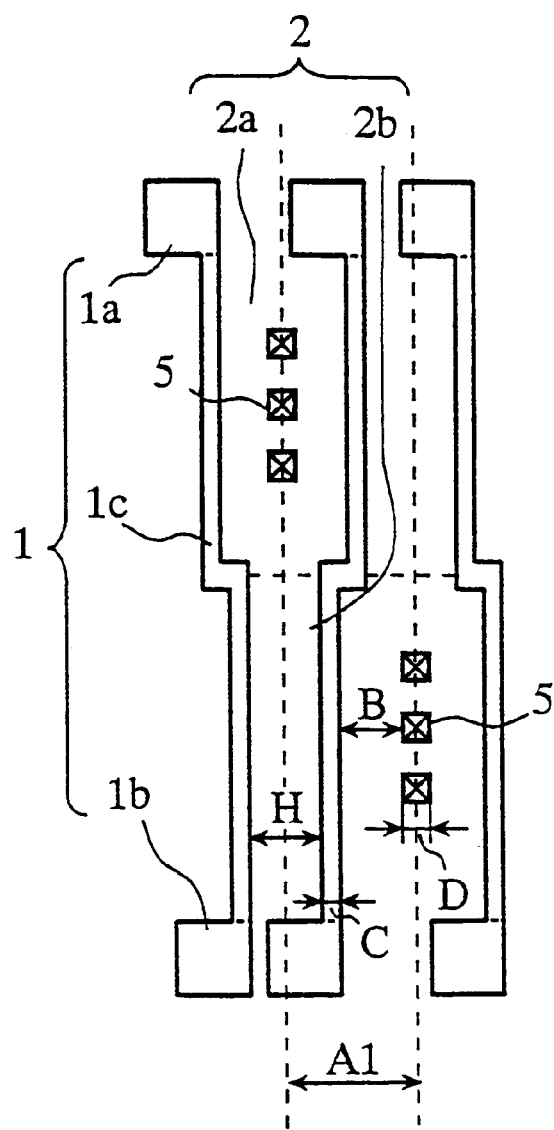

In the first embodiment, as shown in FIG. 2B, the wiring pitch A1 of the first-layer aluminum wiring and the second-layer aluminum wiring along the row direction is A1=B+C+1/2D+1/2H, where B is the minimum distance between the effective width portion 1c of the gate electrode 1 and the contact 5, C is the length of the effective width portion 1c of the gate electrode 1 along the row direction, D is the length of the contact 5 along the row direction, and H is the distance between the effective width portions 1c of the gate electrodes 1 where the non-contact area 2b is interposed, and A>A1. In some cases, the minimum wiring pitch E of the first-layer aluminum wiring and the second-layer aluminum wiring along the row direction permitted by processing limitations is equal to A1. This is because the distance H between the effective width portions 1c of the gate electrodes 1 where the non-contact area 2b is interposed is smaller than the distance 2B+D between the effective width portions 1c of the gate electrodes 1, where the contact area 2a is interposed, and, hence, B+1/2D>1/2H.

According to the first embodiment, by bending the effective width portion 1c of the gate electrode 1 at the boundary between the contact area 2a and the non-contact area 2b, the distance between the effective width portions 1c of the gate electrodes 1 where the non-contact area 2b is interposed is smaller than the distance between the effective width portions 1c of the gate electrodes where the contact area 2a is interposed. Accordingly, the wiring pitch of the first-layer aluminum wiring and the second-layer aluminum wiring along the column direction, in the row direction, is smaller than in the prior art. Thus, first, the occupied area becomes smaller. Second, the degree of integration in the cell area is higher.

Third, since the drain area is smaller than in the prior art, the drain capacitance is smaller than in the prior art and the operating speed of each individual transistor is higher than in the prior art. Fourth, since the length of the effective width portion 1c of the gate electrode 1, i.e., the effective gate width, is larger than in the prior art, the driving capability of each individual transistor can be improved over the prior art.

Figure 3:
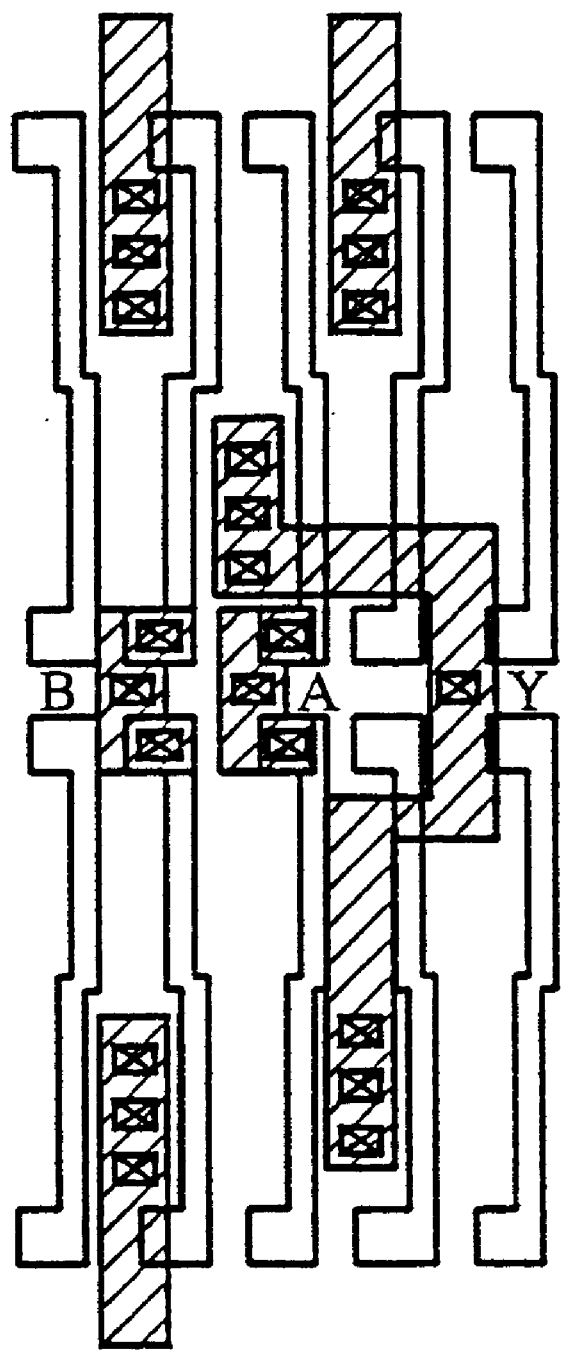
FIG. 3 is a plan view showing an example of a NAND circuit shown in FIG. 7 formed by arranging along the column direction two groups of transistors according to the first embodiment of the invention.
Figure 7:
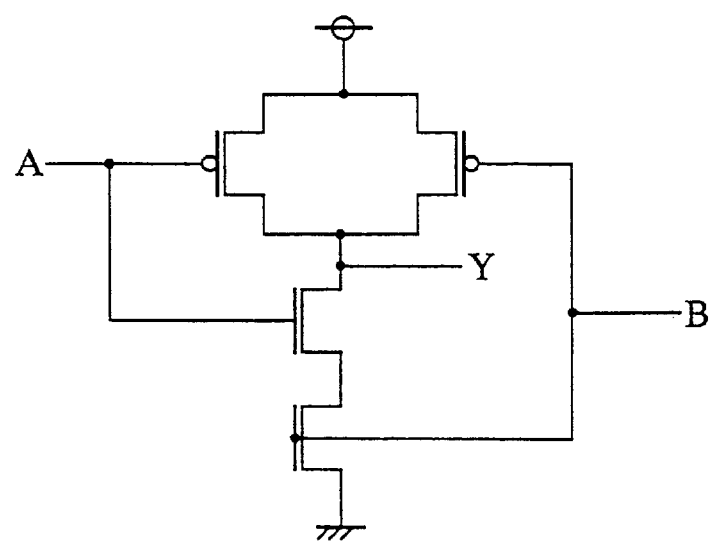
FIG. 7 is a circuit diagram showing a NAND circuit.
Figure 8:
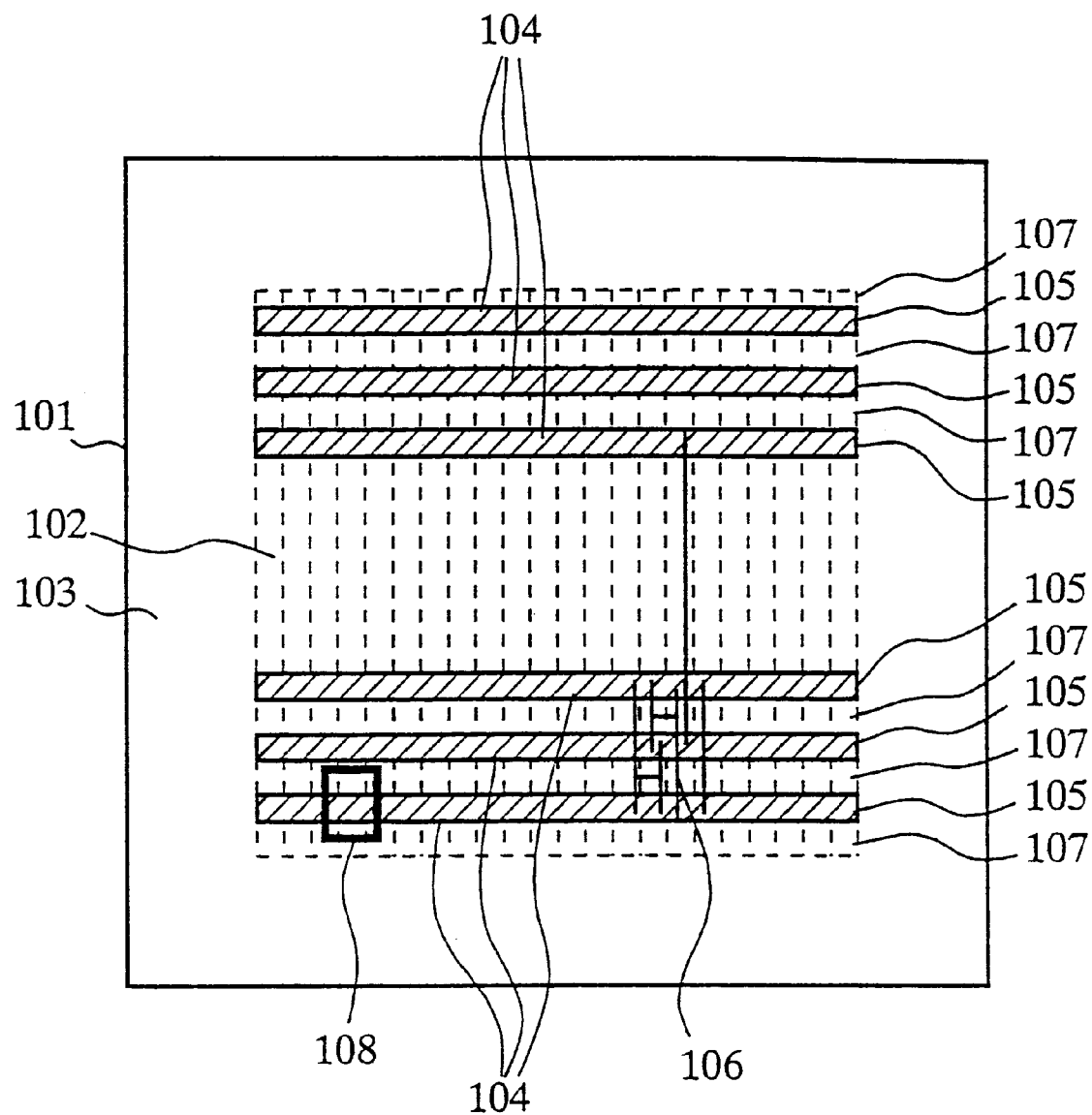
FIG. 8 is a plan view schematically showing the conventional gate array semiconductor integrated circuit device.
Figure 9:
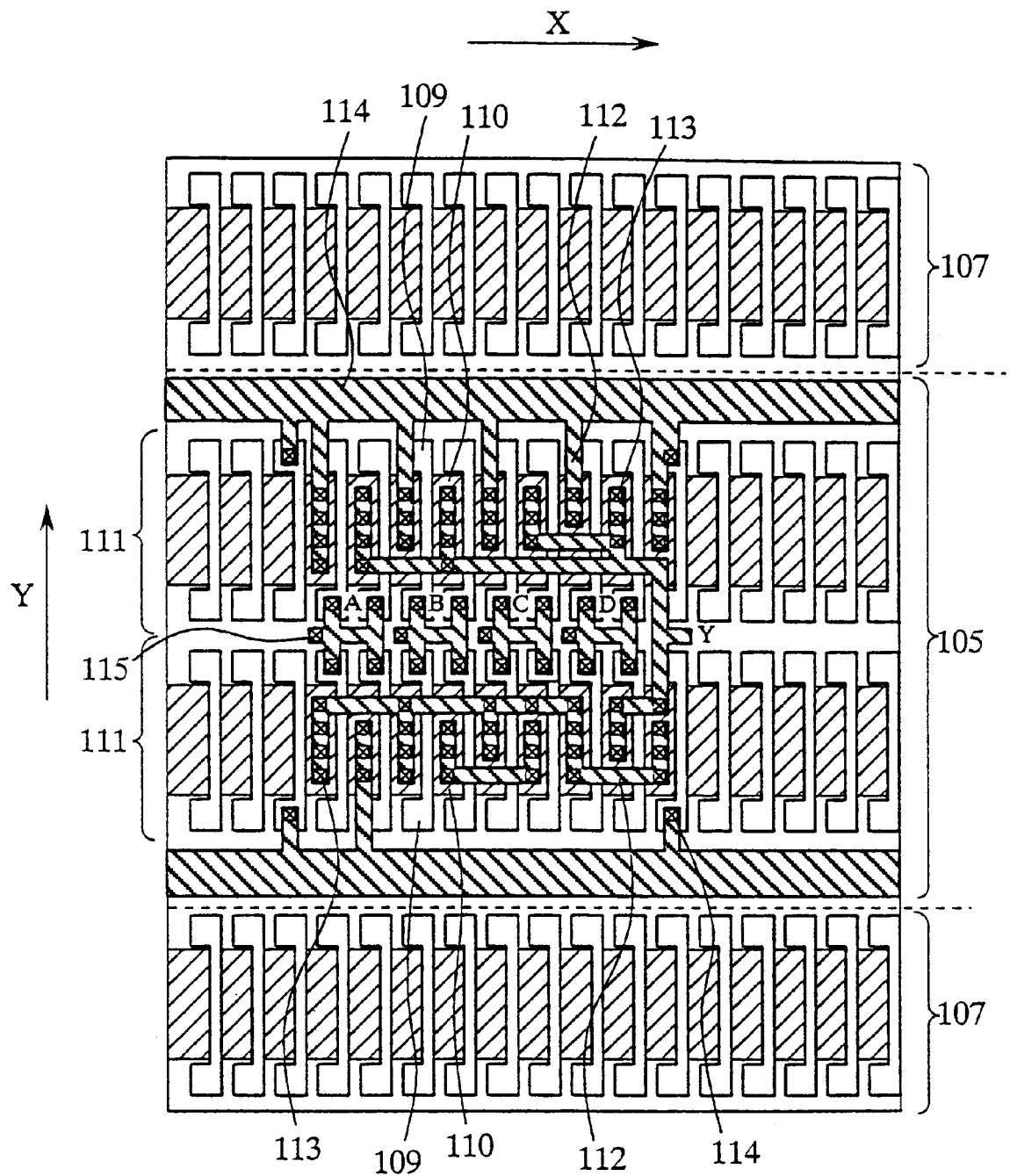
FIG. 9 is a plan view schematically showing the structure of a conventional macro cell.
Figure 10:
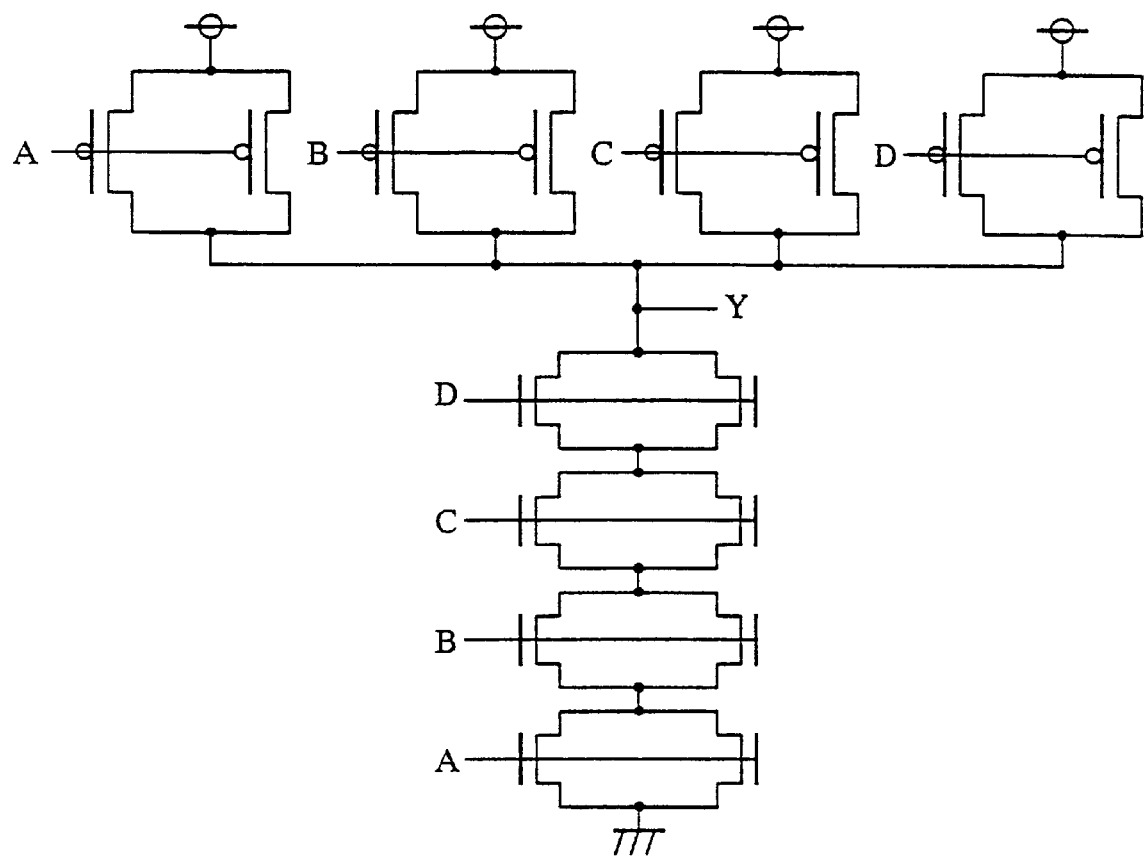
FIG. 10 is a circuit diagram showing a four-input NAND circuit.
Figure 11A:
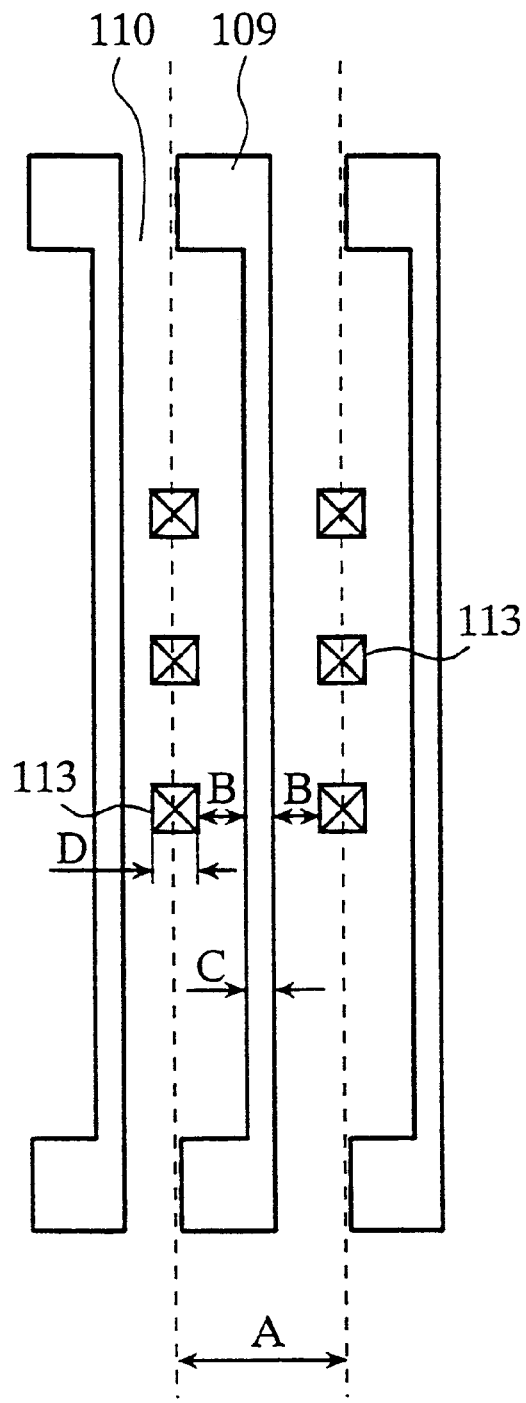
FIG. 11A and FIG. 11B are plan views for describing the wiring pitch of a first-layer aluminum wiring and a second-layer aluminum wiring along the row direction of a conventional macro cell.
Figure 11B:
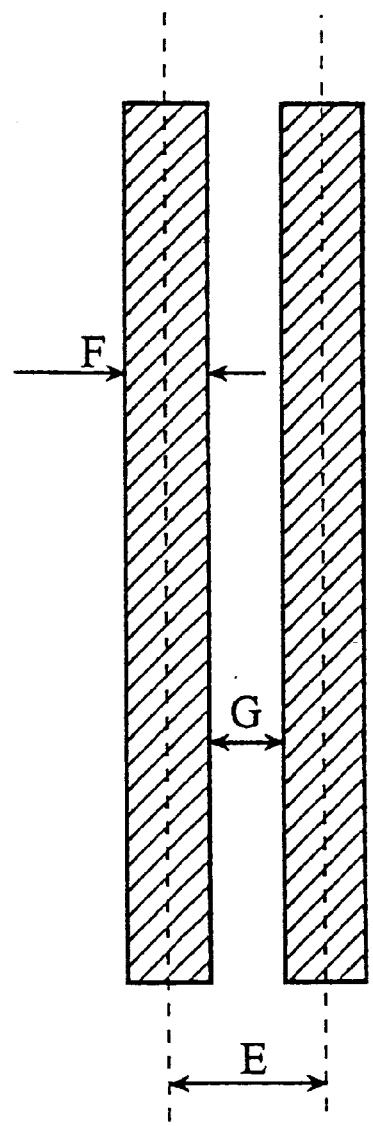

FIG. 3 shows the NAND circuit of FIG. 7 including two groups of the transistors shown in the first embodiment disposed along the column direction with connections between the transistors in which the upper group of transistors are P-channel transistors and the lower group of transistors are N-channel transistors. A, B, and Y in FIG. 3 correspond to A, B, and Y in FIG. 7, respectively.

Second Embodiment

Figure 4:
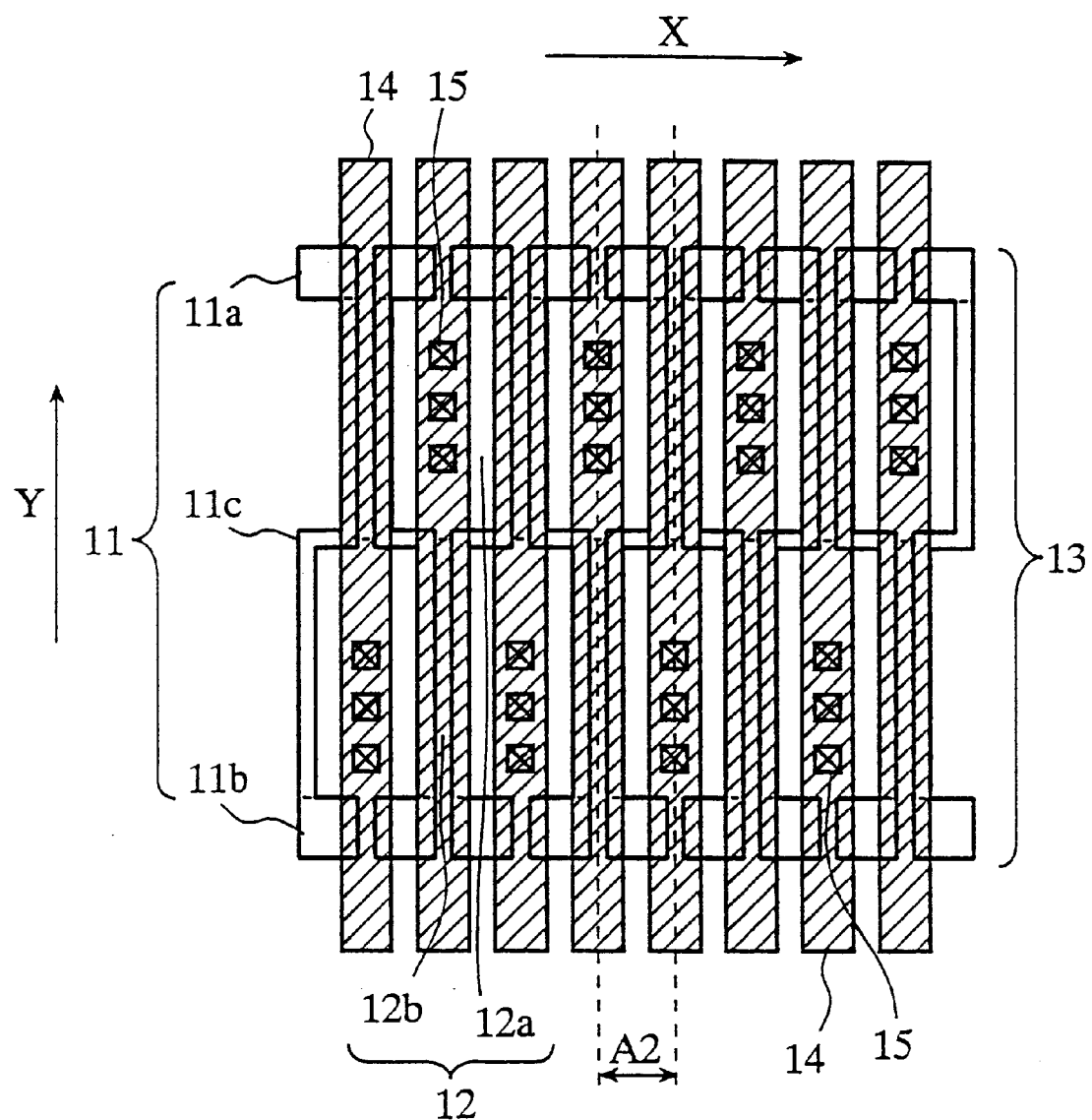
FIG. 4 is a plan view showing in a simplified manner a structure of a macro cell according to a second embodiment of the invention.

FIG. 4 is a plan view showing in a simplified manner the structure of a macro cell according to a second embodiment of the invention. Referring to FIG. 4, a gate electrode 11 oriented in the column direction (in the Y direction in FIG. 4) includes a first end portion 11a having a rectangular shape and located at the upper end portion, a second end portion 11b having a rectangular shape and located at the lower end portion, and an effective width portion 11c connecting the first end portion 11a to the second end portion 11b and bent at the boundary between a contact area 12a and a non-contact area 12b. A source-drain area 12 is located between adjoining gate electrodes 11 and divided, along the column direction, into the contact area 12a with a contact 15 connecting the intra-cell wiring 14 thereto and the non-contact area 12b with no contact 15. A group of transistors 13 including a plurality of gate electrodes 11 is arranged in the row direction (in the X direction in FIG. 4) with the source-drain areas 12 respectively disposed between the effective width portions 11c of adjoining gate electrodes 11. An intra-cell wiring 14 (first-layer wiring) provides a connection between transistors within the macro cell, and a contact 15 connects the intra-cell wiring 14 with the source-drain area 12. Since the structure of the macro cell according to the second embodiment of the invention is shown in a simplified manner in FIG. 4, only the intra-cell wirings 14 along the column direction are shown. Intra-cell wirings along the row direction are not shown. Further, only the contacts 15 connecting the intra-cell wiring 14 to the source-drain area 12 are shown. Contacts connecting the intra-cell wiring 14 with the gate electrode 11 and contacts connecting the intra-cell wiring 14 to the inter-cell wiring are not shown.

The distance between the effective width portions 11c of the gate electrodes 11 located on the side of the first end portion 11a of the gate electrode 11 where a non-contact area 12b is interposed is equal to the distance between the first end portions 11a of the gate electrodes 11. The distance between the effective width portions 11c of the gate electrodes 11 located on the side of the second end portion 11b of the gate electrode 11 where a non-contact area 12b is interposed is equal to the distance between the second end portions 11b of the gate electrodes 11.

In the macro cell according to the second embodiment of the invention, the source-drain area 12 is divided, along the column direction, into the contact area 12a with a contact 15 connecting the intra-cell wiring 14 thereto and the non-contact area 12b with no contact 15. Two source-drain areas 12 are located on opposite sides of an effective width portion 11c of the gate electrode 11, one source-drain area having the contact area 12a at its upper portion and the non-contact area 12b at its lower portion. The other source-drain area has the non-contact area 12b at its upper portion and the contact area 12a at its lower portion.

At the upper portion of a group of transistors 13, the contact areas 12a and the non-contact areas 12b are alternatingly arranged with the effective width portion 11c of a gate electrode 11 interposed, and, at the lower portion of the group of transistors 13, the contact areas 12a and the non-contact areas 12b are alternatingly arranged in reverse sequence to that in the upper portion of the group of transistors 13 with the effective width portion 11c of the gate electrode 11 interposed.

By bending the effective width portion 11c of the gate electrode 11 at the boundary between the contact area 12a and the non-contact area 12b, the distance between the effective width portions 11c of the gate electrodes 11 where the non-contact area 12b is interposed is smaller than the distance between the effective width portions 11c of the gate electrodes 11 where the contact area 12a is interposed, to such an extent that the distance between the effective width portions 11c of the gate electrodes 11 located on the side of the first end portion 11a of the gate electrode 11 where the non-contact area 12b is interposed, is equal to the distance between the first end portions 11a of the gate electrodes 11. The distance between the effective width portions 11c of the gate electrodes 11 located on the side of the second end portion 11b of the gate electrode 11 where the non-contact area 12b is interposed is equal to the distance between the second end portions 11b of the gate electrodes 11.

A gate electrode 11 includes the first and second end portions 11a and 11b disposed in alignment with each other in the column direction and the effective width portion 11c extending from diagonally opposing positions of the first and the second end portions 11a and 11b and joined together at the boundary between the contact area 12a and the non-contact area 12. A plurality of such gate electrodes 11 are arranged along the row direction such that two adjoining gate electrodes are symmetrical with respect to a straight line.

In the second embodiment, the wiring pitch of the first-layer aluminum wiring and the second-layer aluminum wiring, which extend along the column direction, in the row direction, is smaller than in the first embodiment. Namely, in the first embodiment, as shown in FIG. 5A, the wiring pitch A1 of the first-layer aluminum wiring and the second-layer aluminum wiring along the row direction is A1=B+C+1/2D+1/2H, where B is the minimum distance between the effective width portion 1c of the gate electrode 1 and the contact 5, C is the length of the effective width portion 1c of the gate electrode 1 along the row direction, D is the length of the contact 5 along the row direction, and H is the distance between the effective width portions 1c of the gate electrodes 1 where the non-contact area 2b is located. In the second embodiment, as shown in FIG. 5B, the wiring pitch A2 of the first-layer aluminum wiring and the second-layer aluminum wiring along the row direction is A2=B+C+1/2D+1/2I, where B is the minimum distance between the effective width portion 11c of the gate electrode 11 and the contact 15, C is the length of the effective width portion 11c of the gate electrode 11 along the row direction, D is the length of the contact 15 along the row direction, and I is the distance between the effective width portions 11c of the gate electrodes 11 where the non-contact area 12b is interposed between them, and A1>A2. In some cases, even when A1 is not equal to the minimum wiring pitch E, permitted by processing limitations, of the first-layer aluminum wiring and the second-layer aluminum wiring along the row direction, E and A2 become equal. This is because the distance I between the effective width portions 11c of the gate electrodes 11 where the non-contact area 12b is interposed, the second embodiment is smaller than the distance H between the effective width portions 1c of the gate electrodes 1 where the non-contact area 2b is interposed in the first embodiment, and 1/2H>1/2I.

According to the second embodiment, as described above, by bending the effective width portion 11c of the gate electrode 11 at the boundary between the contact area 12a and the non-contact area 12b, the distance between the effective width portions 11c of the gate electrodes 11 where the non-contact area 12b is interposed is smaller than the distance between the effective width portions 11c of the gate electrodes 11 where the contact area 12a is interposed, to such an extent that the distance between the effective width portions 11c of the gate electrodes 11 located on the side of the first end portion 11a of the gate electrode 11 where the non-contact area 12b is interposed is equal to the distance between the first end portions 11a of the gate electrodes 11. The distance between the effective width portions 11c of the gate electrodes 11 located on the side of the second end portion 11b of the gate electrode 11 where the non-contact area 12b is interposed is equal to the distance between the second end portions 11b of the gate electrodes 11. Accordingly, the row wiring pitch of the first-layer aluminum wiring and the second-layer aluminum wiring, which extends along the column direction, in the row direction, is smaller than in the first embodiment. Thus, first, the occupied area becomes smaller than in the first embodiment. Second, the degree of integration in the cell area can be made higher than in the first embodiment. Third, since the drain area is smaller than in the first embodiment, the drain capacitance is smaller than in the first embodiment and the operating speed of each individual transistor is higher than in the first embodiment. Fourth, since the length of the effective width portion 11c of the gate electrode 11, i.e., the effective gate width, is larger than in the first embodiment, the driving capability of each individual transistor can be improved over the first embodiment.

Figure 6:
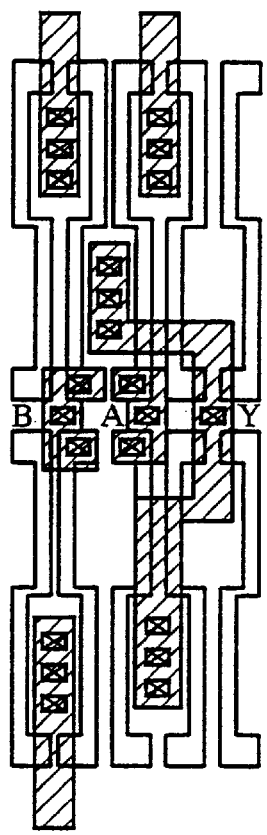
FIG. 6 is a plan view showing an example of a NAND circuit shown in FIG. 7 formed by arranging along the column direction two groups of transistors according to the second embodiment of the invention.

FIG. 6 shows a case where a NAND circuit shown in FIG. 7 includes two groups of the transistors shown in the second embodiment along the column direction and connections between the transistors in which the upper group of transistors are P-channel transistors and the lower group of transistors are N-channel transistors. A, B, and Y in FIG. 6 correspond to A, B, and Y in FIG. 7, respectively.

Third Embodiment

The macro cell in the third embodiment of the invention has a salicide structure in which the gate electrodes and the source-drain areas in the case of first embodiment and the second embodiment are silicided.

A macro cell according to the third embodiment can be fabricated by siliciding the gate electrodes and the source-drain areas at the same time while the gate electrodes and the source-drain areas are kept exposed. Silicidation means reacting silicon (Si) and a metal, such as molybdenum (Mo), tungsten (W), and titan (Ti), to produce a compound, such as $MoSi_2$, $WSi_2$, and $TiSi_2$.

According to the third embodiment, since the macro cell has a salicide structure, the contact resistances of the gate electrode and the source-drain area become smaller.

What is claimed is:

1. A macro cell having at least one group of transistors disposed along a column direction comprising:
   a plurality of gate electrodes disposed along a row direction, transverse to the column direction, each gate electrode being oriented in the column direction and including a first end portion located at an upper end, a second end portion located at a lower end opposite the upper end, and an effective width portion connecting said first end portion to said second end portion; and
   respective source-drain areas disposed between effective width portions of an adjacent pair of said gate electrodes, each source-drain area having, along the column direction, a contact area having a contact for connection to a first layer wiring and a non-contact area having no contact, one source-drain area having, at the first end portion, said contact area and, at the second portion, said non-contact area, another source-drain area having a non-contact area at the first end portion and a contact area at the second end portion, said effective width portion of said gate electrode being bent at a boundary between one of said contact areas and one of said non-contact areas, wherein said effective width portions of an adjacent pair of said gate electrodes, where one of said non-contact areas is interposed between said adjacent pair of said gate electrodes, are separated by a distance smaller than a distance between said effective width portions of said adjacent pair of said gate electrodes where said contact areas are interposed between said adjacent pair of said gate electrodes and the distance between said effective width portions of said adjacent pair of said gate electrodes where said non-contact area is interposed between said pair of adjacent gate electrodes is equal to the distance between said first end portions of said gate electrodes and the distance between said effective width portions of said adjacent pair of said gate electrodes where said non-contact area is interposed between said pair of adjacent gate electrode is equal to a distance between said second end portions of said gate electrodes.

2. The macro cell according to claim 1, wherein said macro cell has a salicide structure in which said gate electrode and said source-drain areas are silicided.

3. A macro cell having at least one group of transistors disposed along a column direction comprising:
   a plurality of gate electrodes disposed along a row direction, transverse to the column direction, each gate electrode being oriented in the column direction and including a first end portion located at an upper end, a second end portion located at a lower end opposite the upper end, and an effective width portion connecting said first end portion to said second end portion; and respective source-drain areas disposed between effective width portions of an adjacent pair of said gate electrodes, each source-drain area having, alone the column direction, a contact area having a contact for connection to a first layer wiring and a non-contact area having no contact, one source-drain area having, at the first end portion, said contact area and, at the second portion, said non-contact area, another source-drain area having a non-contact area at the first end portion and a contact area at the second end portion, said effective width portion of said gate electrode being bent at a boundary between one of said contact areas and one of said non-contact areas, wherein said effective width portions of an adjacent pair of said gate electrodes, where one of said non-contact areas is interposed between said adjacent pair of said gate electrodes, are separated by a distance smaller than a distance between said effective width portions of said adjacent pair of said gate electrodes where said contact areas are interposed between said adjacent pair of said gate electrodes and said effective width portion of said gate electrode is perpendicular to said first and second ends of said gate electrode.

4. The macro cell according to claim 3, wherein said macro cell has a salicide structure in which said gate electrode and said source-drain areas are silicided.

5. A macro cell having at least one group of transistors disposed along a column direction comprising:

a plurality of gate electrodes disposed along a row direction, transverse to the column direction, each gate electrode being oriented in the column direction and including a first end portion located at an upper end, a second end portion located at a lower end opposite the upper end, and an effective width portion connecting said first end portion to said second end portion; and respective source-drain areas disposed between effective width portions of an adjacent pair of said gate electrodes, each source-drain area having, along the column direction, a contact area having a contact for connection to a first layer wiring and a non-contact area having no contact, one source-drain area having, at the first end portion, said contact area and, at the second portion, said non-contact area, another source-drain area having a non-contact area at the first end portion and a contact area at the second end portion, said effective width portion of said gate electrode being bent at a boundary between one of said contact areas and one of said non-contact areas, wherein said effective width portions of an adjacent pair of said gate electrodes, where one of said non-contact areas is interposed between said adjacent pair of said gate electrodes, are separated by a distance smaller than a distance between said effective width portions of said adjacent pair of said gate electrodes where said contact areas are interposed between said adjacent pair of said gate electrodes, and wherein the distance between said effective width portions of a first adjacent pair of said gate electrodes at said first end portion where a non-contact area is interposed between said first adjacent pair of said gate electrodes is equal to the distance between said effective width portions of a second adjacent pair of said gate electrodes at said second end portion where said non-contact area is interposed between said second adjacent pair of said gate electrodes.

6. The macro cell according to claim 5, wherein said macro cell has a salicide structure in which said gate electrode and said source-drain areas are silicided.

* * * * *